(12) United States Patent
Arnold et al.

(10) Patent No.: US 11,302,533 B2
(45) Date of Patent: *Apr. 12, 2022

(54) SELECTIVE GAS ETCHING FOR SELF-ALIGNED PATTERN TRANSFER

(71) Applicant: Tessera, Inc., San Jose, CA (US)

(72) Inventors: John Christopher Arnold, North Chatham, NY (US); Sean D. Burns, Hopewell Junction, NY (US); Yann Alain Marcel Mignot, Slingerlands, NY (US); Yongan Xu, Albany, NY (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/181,269

(22) Filed: Feb. 22, 2021

(65) Prior Publication Data
US 2021/0183653 A1 Jun. 17, 2021

Related U.S. Application Data

(63) Continuation of application No. 16/682,588, filed on Nov. 13, 2019, now Pat. No. 10,930,504, which is a
(Continued)

(51) Int. Cl.
*H01L 21/033* (2006.01)
*H01L 21/027* (2006.01)
(Continued)

(52) U.S. Cl.
CPC ...... *H01L 21/0337* (2013.01); *H01L 21/0217* (2013.01); *H01L 21/0276* (2013.01); *H01L 21/02123* (2013.01); *H01L 21/02186* (2013.01); *H01L 21/0332* (2013.01); *H01L 21/308* (2013.01); *H01L 21/3065* (2013.01); *H01L 21/3086* (2013.01); *H01L 21/30604* (2013.01); *H01L 21/30621* (2013.01); *H01L 21/31* (2013.01); *H01L 21/31116* (2013.01); *H01L 21/31122* (2013.01); *H01L 21/31138* (2013.01); *H01L 21/31144* (2013.01); *H01L 21/76816* (2013.01)

(58) Field of Classification Search
None
See application file for complete search history.

(56) References Cited

U.S. PATENT DOCUMENTS 6,379,872 B1 4/2002 Hineman et al.
8,883,649 B2 11/2014 Yin et al.
(Continued)

OTHER PUBLICATIONS

List of IBM Patents or Patent Applications treated as Related dated Nov. 13, 2019, 2 pages.

*Primary Examiner* — Stephanie P Duclair
(74) *Attorney, Agent, or Firm* — Lee & Hayes, P.C.

(57) ABSTRACT

Selective gas etching for self-aligned pattern transfer uses a first block and a separate second block formed in a sacrificial layer to transfer critical dimensions to a desired final layer using a selective gas etching process. The first block is a first hardmask material that can be plasma etched using a first gas, and the second block is a second hardmask material that can be plasma etched using a second gas separate from the first gas. The first hardmask material is not plasma etched using the second gas, and the second hardmask material is not plasma etched using the first gas.

20 Claims, 11 Drawing Sheets

Related U.S. Application Data continuation of application No. 16/001,426, filed on Jun. 6, 2018, now Pat. No. 10,559,467, which is a continuation of application No. 15/284,862, filed on Oct. 4, 2016, now Pat. No. 10,032,632.

(51) Int. Cl.
| | |
|---|---|
| *H01L 21/768* | (2006.01) |
| *H01L 21/308* | (2006.01) |
| *H01L 21/306* | (2006.01) |
| *H01L 21/3065* | (2006.01) |
| *H01L 21/31* | (2006.01) |
| *H01L 21/311* | (2006.01) |
| *H01L 21/02* | (2006.01) |

(56) References Cited

U.S. PATENT DOCUMENTS

| | | |
|---|---|---|
| 9,064,813 B2 | 6/2015 | Kanakasabapathy et al. |
| 9,379,017 B1 | 6/2016 | Sung et al. |
| 2011/0130007 A1 | 6/2011 | Ching et al. |
| 2013/0001749 A1 | 1/2013 | Arnold et al. |
| 2013/0216776 A1 | 8/2013 | Arnold et al. |
| 2014/0199628 A1 | 7/2014 | Edelstein et al. |
| 2016/0093502 A1 | 3/2016 | Cheng et al. |
| 2016/0118263 A1 | 4/2016 | Leobandung |
| 2016/0163600 A1 | 6/2016 | Colburn et al. |

SELECTIVE GAS ETCHING FOR SELF-ALIGNED PATTERN TRANSFER

CROSS-REFERENCE TO RELATED APPLICATION

This patent application is a continuation of and claims priority to U.S. patent application Ser. No. 16/682,588, filed Nov. 13, 2019, which is a continuation of U.S. patent application Ser. No. 16/001,426, filed Jun. 6, 2018, now U.S. Pat. No. 10,559,467, issued Feb. 11, 2020, which is a continuation of U.S. patent application Ser. No. 15/284,862, filed Oct. 4, 2016, now U.S. Pat. No. 10,032,632, issued Jul. 24, 2018, which are fully incorporated herein by reference.

FIELD OF THE INVENTION

The present invention relates to semiconductor fabrication and in particular to semiconductor fabrication in the 7 nm node and beyond.

BACKGROUND OF THE INVENTION

Semiconductor fabrication involves the creation of the desired pattern into a layer or layers of material. Creation of the desired pattern into a specific layer involves a pattern transfer process that utilizes masks in combination with conventional etching processes such as optical lithography and sidewall image transfer (SIT). The need for the creation of desired patterns having pitches of 26 nm or less and nodes of 10 nm or less including both two-dimensional and three-dimensional patterns exposes the limitations of conventional methods for image creation and transfer. For example, a block cut is needed for both mandrel and non-mandrel metals wires. However, block pattern overlay is a continuing problem as the pattern pitch decreases. Existing block masks will cut wires that do not need to be cut. In addition, tall spacers cause pitch walking, and existing processes can damage spacers and mandrel materials. Therefore, a semiconductor fabrication process is desired that compensates for the limitation of a 40 nm pillar size, overlay shift and critical dimension uniformity.

SUMMARY OF THE INVENTION

Exemplary embodiments are directed to systems and methods for creating and transforming patterns in semiconductor fabrication where the pattern has a small pitch, e.g., 26 nm, and is a 10 nm node, a 7 nm node or a 5 nm node. A selective, i.e., a chemistry selective gas etching process is utilized that provides for self-aligned transfer of the desired patterns and critical dimensions to the appropriate semiconductor layer. The materials of the different layers and masks are chosen so that these layers and masks are selectively etched using a gas etching process by varying the chemistry of the gas etching process. To achieve the desired pitch, two block masks are used, a first bock mask and a second block mask. Each block mask is formed from a different hardmask material. The hardmask material of each block facilitates the selective etching.

Each block mask is positioned to mask and to cut the desired portions of the semiconductor layer. In one embodiment, the first block mask is arranged to cut mandrel wire, and the second block mask is arranged to cut non-mandrel wire. The first and second block masks are preferably formed on a common layer. In one embodiment, a sidewall image process (SIT) is utilized after the first and second block masks are formed. The SIT process applies an arrangement of mandrels and spacers over the layer containing the first and second block masks. The mandrels and spaces are aligned such that the first block mask is located below a mandrel and has a dimension extending perpendicular to the mandrels that is at least as big at the width of the mandrel and the spacer on either side of the mandrel. In addition, the second block mask is located below a space between adjacent mandrels and has a dimension extending perpendicular to the mandrels that is at least as big at the width of the space between the mandrels and the spacers on either side of the space. Selective gas etching during the SIT process is then used to transfer the mandrel and spacer dimension to the first block mask and the space and spacer dimensions to the second block mask. These first and second block masks are then used to transfer these dimensions to lower layers. Therefore, smaller dimensions can be transferred or printed on the desired layers using a gas etching process that overcomes the limitations of physical printing and etching processes.

Exemplary embodiments are directed to a method for selective gas etching for self-aligned pattern transfer. A first block is formed in a sacrificial layer. The first block is made of a first hardmask material that can be plasma etched using a first gas. A second block separate from the first block is also formed in the sacrificial layer. The second block is formed of a second hardmask material that can be plasma etched using a second gas separate from the first gas. The first and second harmask materials are selected such that the first hardmask material is not plasma etched using the second gas, and the second hardmask material is not plasma etched using the first gas. In one embodiment, the first block and the second block have dimensions along the sacrificial layer, e.g., in two dimensions, greater than or equal to critical dimensions to be transferred to layers below the sacrificial layer. In one embodiment, the first hardmask material and the second hardmask material comprise inorganic hardmask materials. For example, the first hardmask material is titanium nitride, and the second hardmask material is silicon nitride.

In one embodiment of forming the first block, the first hardmask material is deposited across the sacrificial layer, and a first photoresist stack having a silicon containing anti-reflective coating and an organic planarization layer is formed on the first hardmask material. The first photoresist stack has a size and location corresponding to the first block. Reactive ion etching with carbon tetrafluoride is used to remove the silicon containing anti-reflective coating. Then, reactive ion etching with chlorine gas is used to etch the first hardmask material. Plasma etching is used to remove the organic planarization layer, leaving only the first block in the sacrificial layer.

In one embodiment, forming the second block includes depositing the second hardmask material across the sacrificial layer and over the first block. The second hardmask material thickness is adjusted to equal a first block thickness, and a second photoresist stack having a silicon containing anti-reflective coating and an organic planarization layer is formed on the second hardmask material. The second photoresist stack has a size and location corresponding to the second block. Reactive ion etching with fluoromethane is used to remove the silicon containing anti-reflective coating and to etch the second hardmask material, and plasma etching is used to remove the organic planarization layer, leaving only the second block and the first block in the sacrificial layer. The resulting sacrificial layer containing the first block and the second block is used in sidewall image transfer to transfer a desired pattern into layers below the sacrificial layer. In one embodiment, using the sacrificial layer comprising the first block and the second block in sidewall image transfer further includes using the first block to transfer a mandrel critical dimension to layers below the sacrificial layer and using the second block to transfer a non-mandrel critical dimension to the layers below the sacrificial layer.

In one embodiment, a titanium containing anti-reflective coating is deposited across the sacrificial layer and over the first block and second block. A titanium containing anti-reflective coating thickness is adjusted to equal a first block thickness and a second block thickness. A plurality of amorphous silicon mandrels are formed on the sacrificial layer such that one amorphous silicon mandrel is located above the first block and one space between adjacent amorphous silicon mandrels is located above the second block. In order to form the plurality of amorphous silicon mandrels on the sacrificial layer, an amorphous silicon layer is deposited on the sacrificial layer, and an organic planarization layer is deposited on the amorphous silicon layer. A silicon containing anti-reflective coating layer is deposited on the organic planarization layer, and a plurality of resist mandrels is formed on the silicon containing anti-reflective coating layer. The amorphous silicon layer is etched to form the plurality of amorphous silicon mandrels corresponding to the plurality of resist mandrels.

In one embodiment, an oxide spacer is deposited over the plurality of amorphous silicon mandrels and the sacrificial layer, and anisotropic etching is use to remove the oxide spacer from a top of each amorphous silicon spacer and from the space between adjacent amorphous silicon mandrels, leaving an oxide spacer on either side or each amorphous silicon mandrel. In one embodiment, the first block extends completely under one of the amorphous silicon mandrels and the oxide spacers on either side of one of the amorphous silicon mandrels, and the second block extends completely under the one space between adjacent amorphous silicon mandrels and oxide spacers located on either side of the one space between adjacent amorphous silicon spacers. The first gas and the second gas are used in reactive ion etching to transfer a first critical dimension defined by one of the amorphous silicon mandrels and the oxide spaces on either side of one of the amorphous silicon mandrels to the first block and to transfer a second critical dimension defined by the one space between adjacent amorphous silicon mandrels and oxide spacers located on either side of the one space between adjacent amorphous silicon mandrels to the second block.

In one embodiment, reactive ion etching with the first gas is used to transfer the first critical dimension to the first block, to transfer the first critical dimension into the titanium containing anti-reflective coating layer located under amorphous silicon mandrels and the oxide spaces on either side of the amorphous silicon mandrels and to remove the first block and titanium containing anti-reflective coating layer located in spaces between oxide spacers located on either side of spaces between adjacent amorphous silicon mandrels. In addition, reactive ion etching with the second gas is used to transfer the second critical dimension to the second block and to transfer a spacer width for each oxide spacer to the titanium containing anti-reflective coating layer. In one embodiment, the first gas is chlorine gas, and the second gas is carbon tetraflouride gas.

In one embodiment, all spaces between oxide spacers located on either side of spaces between adjacent amorphous silicon mandrels are filled with a backfill organic planarization layer following reactive ion etching with the first gas. Reactive ion etching with hydrogen bromide is then used to remove the amorphous silicon mandrels before reactive ion etching with the second gas. Plasma etching removes the backfill organic planarization layer, and oxide reactive ion etching is used to remove the plurality of oxide spacers and to etch a final pattern into an oxide layer below the sacrificial layer. The final pattern is defined by the second block, the first block and the spacers widths in the titanium containing anti-reflective coating layer corresponding to each oxide spacer in the plurality of oxide spacers in the sacrificial layer. In one embodiment, reactive ion etching with ion gas is used to etch the final pattern into a final layer below the oxide layer and to remove the sacrificial layer. In one embodiment, the final layer is titanium nitride.

DETAILED DESCRIPTION

Exemplary embodiments provide for the manufacture of semiconductor devices having a pitch of 26 nm or less. These semiconductor devices include 10 nm node, 7 nm node and 5 nm node devices. An etching process that can utilize different gases is used in the transfer the desired pattern to the desired layer in the semiconductor. Changing the gas used in the etching process changes the materials that will be etched by the etching process. Therefore, the materials used in the blocks, masks and sacrificial layers to transfer the desired pattern to the desired layer are chosen based upon an ability to be selectively etched through varying the chemistry, i.e., the gas, in the etching process. In addition, the etching process allows for the transfer of smaller critical dimensions.

Exemplary embodiments are directed to the semiconductor product made according to the methods of the present invention. In addition, exemplary embodiments are directed to a semiconductor product having the improved tolerances in a 10 nm or 7 nm node for semiconductor patterns with a pitch of less than about 26 nm. In general, formation of the semiconductor product is a multi-layer process in which layers of different materials are deposited and etch in order to transfer a pattern to a given final layer of material. Multiple final layers can be etched to achieve the desired two-dimensional and three-dimensional patterns in the overall semiconductor product.

Figure 1:
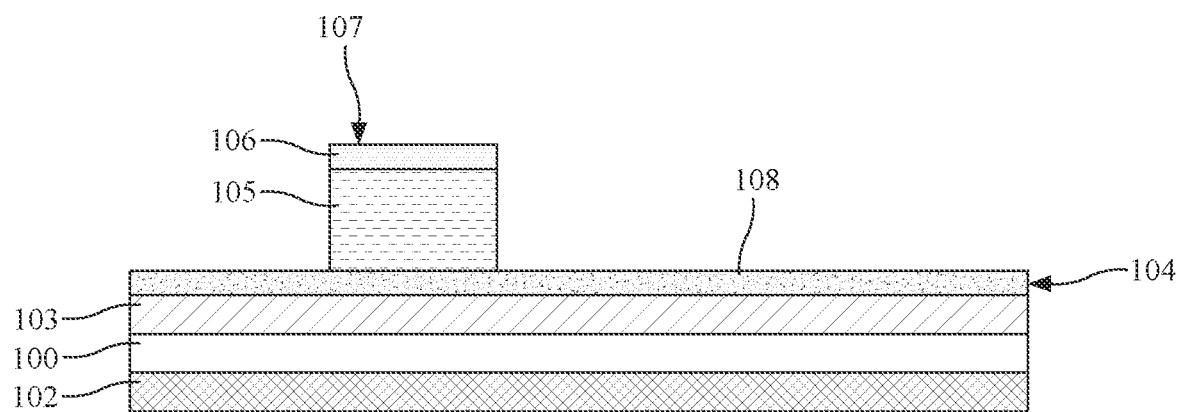
FIG. 1 is a schematic representation of a sacrificial layer of titanium nitride over lower layers with a photoresist mask over a portion of the titanium nitride.

Referring initially to FIG. 1, a final layer 100 of material is formed or deposited on a support 102. Suitable materials for the final layer include, but are not limited to, titanium nitride (TiN) and silicon. The final layer can be formed or deposited using any known and available method including, but not limited to, chemical vapor deposition and physical vapor deposition. An oxide layer 103, for example, silicon oxide ($SiO_2$), is formed over the final layer. Any suitable method for forming or depositing the oxide layer that is known and available in the art can be used.

The transfer of the desired pattern into the desired layer utilizes two separate blocks formed into a common sacrificial layer 104. Therefore, a first hardmask material 108 is deposited into the sacrificial layer. Suitable methods for depositing the first hardmask material include, but are not limited to, chemical vapor deposition and physical vapor deposition. Suitable materials for the first hardmask material include inorganic hardmask materials, for example TiN, silicon nitride (SiN) and silicon oxynitride (SiON). Preferably, the first hard mask material is TiN. To form the desired size and shape of the first block in two dimensions across the sacrificial layer, a first block mask 107, having the desired size and shape of the first block is placed on the first hardmask material at the desired location of the first block. Suitable methods for applying the first block mask include, but are not limited to, ultraviolet resistivity and optical resistivity. The first block mask includes an organic planarization layer (OPL) 105 in contact with the first hardmask 108 and a silicon containing anti-reflective coating (SiARC) 106 located on top of the OPL such that the OPL is between the SiARC and the first hardmask material.

Figure 2:
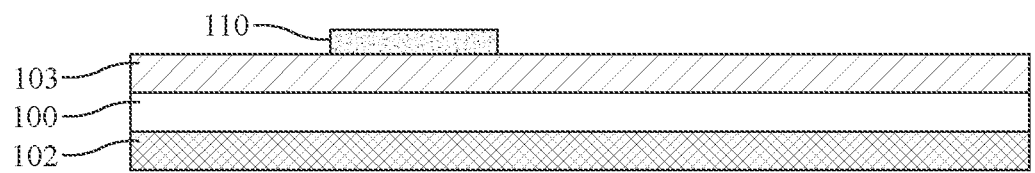
FIG. 2 is a schematic representation of the titanium nitride etched to form a first block in the sacrificial layer.

Referring now to FIG. 2, the shape defined by the first block mask is then transferred or etched into the first hardmask material to create the first block 110 in the sacrificial layer. Several steps are used to remove the first block mask and to etch the first hardmask material. In a first step, the SiARC is removed using gas plasma etching such as reactive ion etching (RIE) with a gas that will etch or remove SiARC. Preferably, this gas is carbon tetraflouride ($CF_4$). In the second step, a gas plasma etching, e.g., RIE, is again used, however, with chlorine gas ($Cl_2$). This removes the first hardmask material that is not under the OPL, etching the size and shape of the OPL into the first hardmask material. The OPL is then removed using any suitable process for etching or removing an OPL that is known and available in the art. At this point, only the first block 110 remains in the sacrificial layer.

Figure 3:
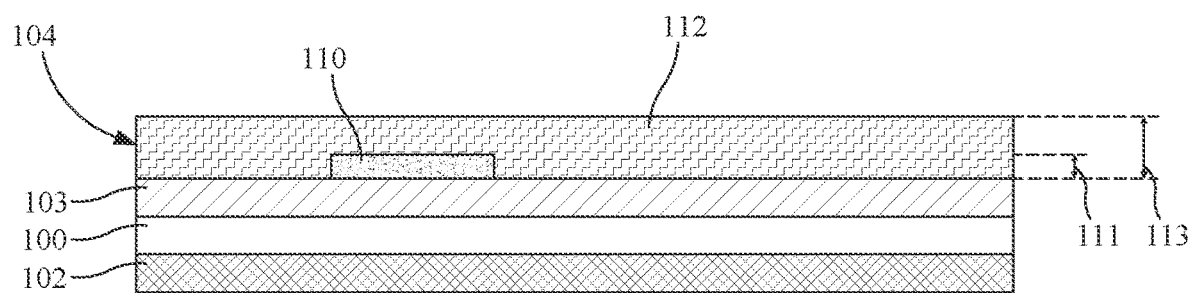
FIG. 3 is a schematic representation of the sacrificial layer being filled and the first block being covered by a layer of silicon nitride.
Figure 4:
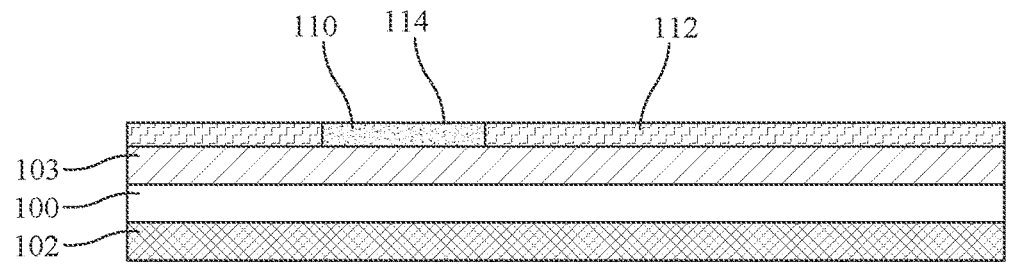
FIG. 4 is a schematic representation of the silicon nitride in the sacrificial layer etched to a thickness equal to the first block.

Having formed the first of the two separate blocks at the desired location in the sacrificial layer, the second of the two separate blocks can be formed at another desired location in the common sacrificial layer 104. Referring to FIG. 3, a second hardmask material 112 is deposited into the sacrificial layer 104 and completely over and around the first block 110 such that the thickness 113 of the second hardmask material is greater than the thickness 111 of the first block. Suitable methods for depositing the second hardmask material include, but are not limited to, chemical vapor deposition and physical vapor deposition. Suitable materials for the second hardmask material include inorganic hardmask materials, for example TiN, silicon nitride (SiN) and silicon oxynitride (SiON). Preferably, the material of the second hard mask material is SiN. Therefore, the first hard mask material is etched using a first gas which does not etch the second hardmask material, and the second hardmask material is etched by a second gas that does not etch the first hardmask material. This facilitates selective gas plasma etching of the first and second hardmask materials. Referring to FIG. 4, the thickness of the second hardmask material is adjusted or decreased to equal the thickness of the first block 110 and to expose a top 114 of the first block in the sacrificial layer. Suitable methods for adjusting the thickness of the second hardmask material include, but are not limited to, using RIE and a chemical-mechanical polish (CMP).

Figure 5:
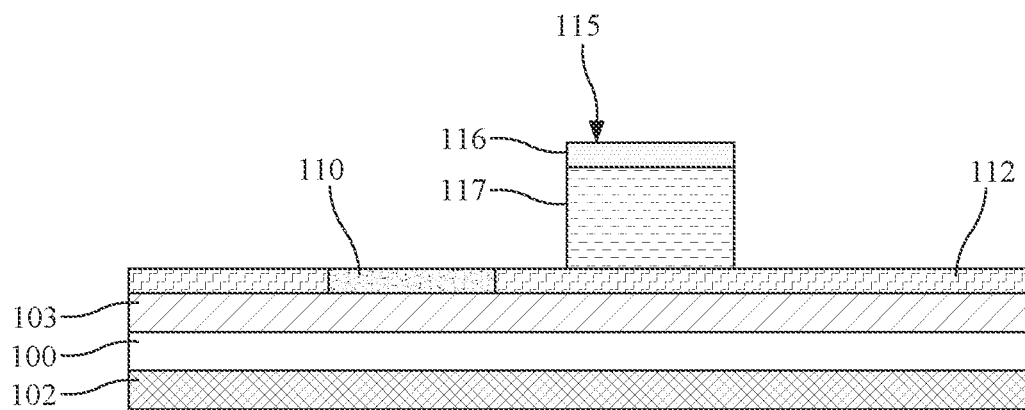
FIG. 5 is a schematic representation of a photoresist mask over a portion of the silicon nitride in the sacrificial layer.

Referring to FIG. 5, to form the desired size and shape of the second block in two dimensions across the sacrificial layer, a second block mask 115, having the desired size and shape of the second block is placed on the second hardmask material 112 at the desired location of the second block. This location is separate and spaced from the location of the first block 110 in the sacrificial layer. Suitable methods for applying the second block mask include, but are not limited to, ultraviolet resistivity and optical resistivity. The second block mask includes an OPL 117 in contact with the second hardmask material 112 and a SiARC 116 located on top of the OPL such that the OPL is between the SiARC and the second hardmask material.

Figure 6:
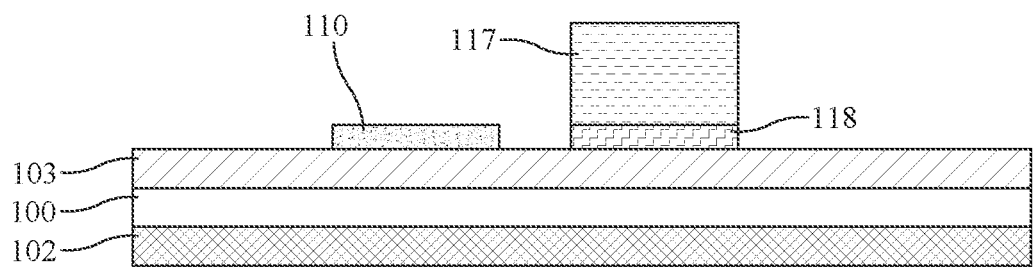
FIG. 6 is a schematic representation of the silicon nitride etched to the second block and an OPL on top of the second block.
Figure 7:
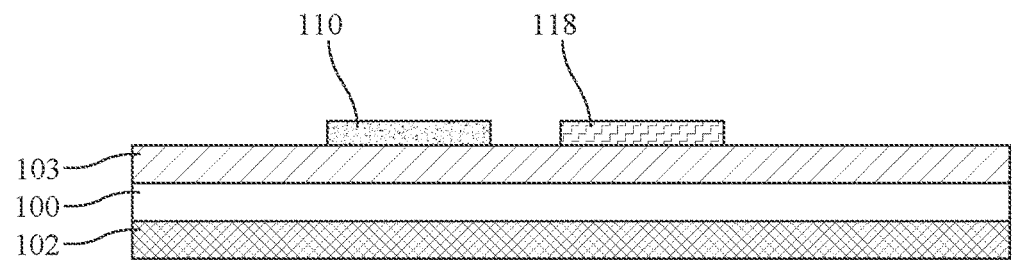
FIG. 7 is a schematic representation of the OPL removed, leaving only the first block and the second block in the sacrificial layer.

Referring now to FIG. 6, the shape defined by the second block mask is then transferred or etched into the second hardmask material to create the second block 118 in the sacrificial layer without affecting the first block 110. Two steps are used to remove the second block mask and to etch the second hardmask material. In a first step, the SiARC is removed and the second hardmask material is etched at the same time using gas plasma etching such as RIE with a gas that will etch or remove SiARC and the second hardmask material, e.g., fluoromethane gas ($CH_3F$). This removes the second hardmask material that is not under the OPL, etching the size and shape of the OPL into the second hardmask material. In the second step, the OPL is then removed using any suitable process for etching or removing an OPL that is known and available in the art. Referring to FIG. 7, at this point, only the first block 110 and the second block 118 remain in the sacrificial layer. While the removal of the SiARC and the second hardmask material may result in some removal or gouging of the oxide layer 103, this layer is also a sacrificial layer, a slight gouging can be tolerated.

Figure 8:
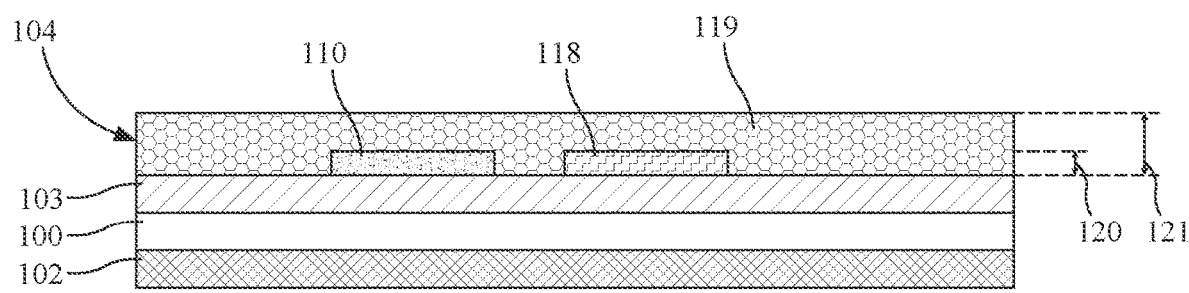
FIG. 8 is a schematic representation of the sacrificial layer being filled and the first and second blocks being covered by a filler layer of titanium containing anti-reflective coating.
Figure 9:
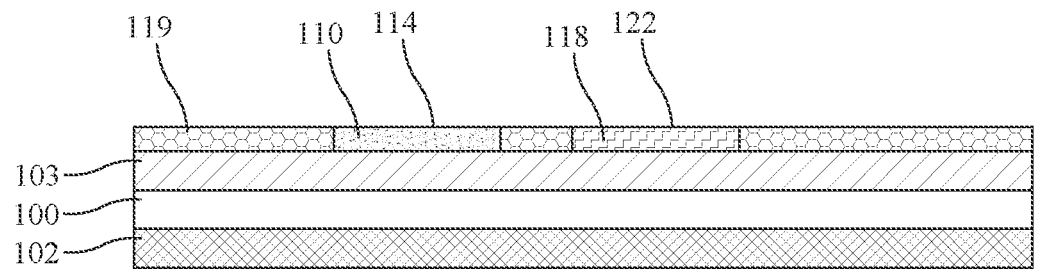
FIG. 9 is a schematic representation of the SiARC in the sacrificial layer adjusted to a thickness equal to the first and second blocks.

Referring now to FIG. 8, the complete sacrificial layer 104 is established by depositing a filling material 119 in the sacrificial layer and over the first block 110 and second block 118. Suitable filling materials are chosen to be selectively etched with either one of the first and second hardmask materials. In one embodiment, the filling material is a titanium containing anti-reflective coating (TiARC). Suitable methods for depositing the filling material include, but are not limited to, chemical vapor deposition and physical vapor deposition. The filling material is deposited to this thickness 121 greater than a thickness 122 of the first and second blocks. Referring to FIG. 9, the thickness of the filling material 119 is adjusted or decreased to equal the thickness of the first block 110 and the second block 118 and to expose a top 114 of the first block and a top 122 of the second block in the sacrificial layer. Suitable methods for adjusting the thickness of the filling material include, but are not limited to, using RIE recess and CMP.

Figure 10:
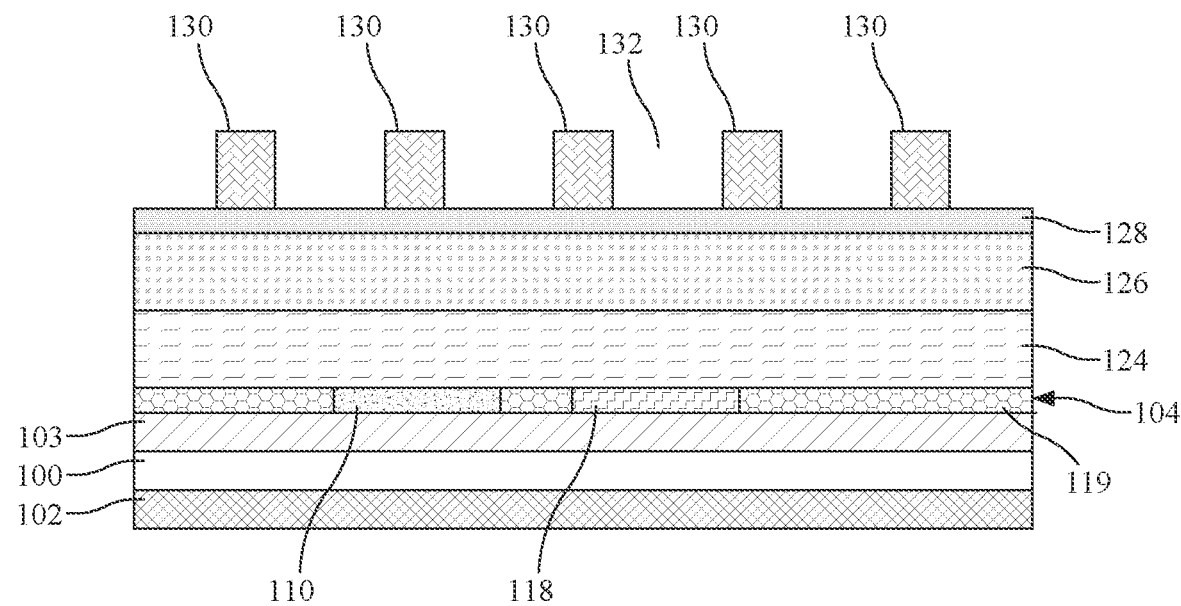
FIG. 10 is a schematic representation of a plurality of resist mandrels formed over the sacrificial layer.

The resulting first and second block in the sacrificial layer are then used in the transfer of the critical dimensions of a desired pattern to the final layer using a sidewall image transfer (SIT) process. Referring now to FIG. 10, an amorphous silicon layer 124 is deposited over the sacrificial layer 104, and another OPL layer 126 is deposited over the amorphous silicon layer. An organic anti-reflection coating layer 128 such as a silicon containing anti-reflective coating (SiARC) layer is deposited over the OPL layer. Any suitable methods known and available in the art form forming or depositing these layers including CMP and physical vapor deposition. The plurality of resist mandrels 130 are then formed and spaced on the top of the SiARC layer. One of the resist mandrels is located over the first block 110, and one of the spaces 132 between a pair of adjacent resist mandrels is located over the second block 118.

Figure 11:
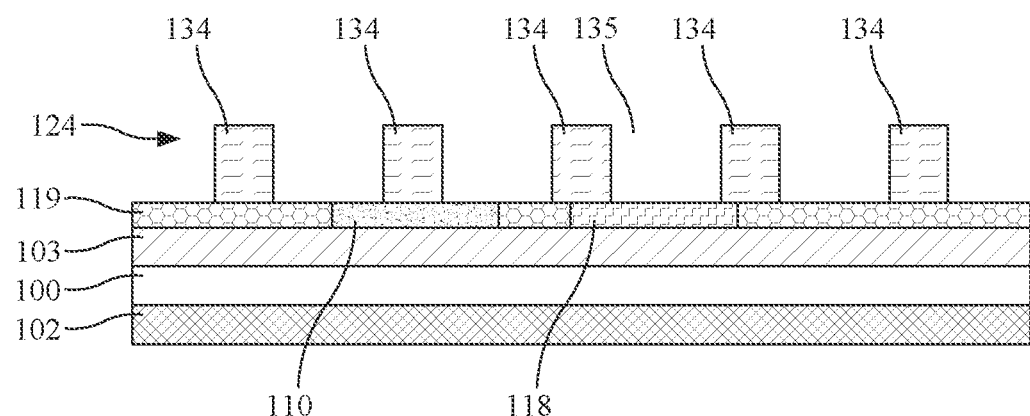
FIG. 11 is a schematic representation of the pattern of the resist mandrels transferred to an amorphous silicon layer on top of the sacrificial layer.
Figure 12:
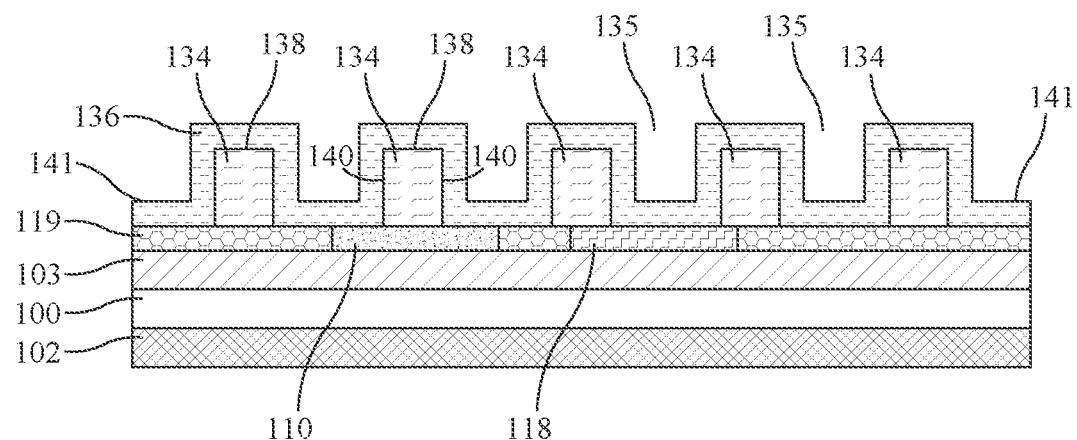
FIG. 12 is a schematic representation of an oxide spacer formed over the amorphous silicon mandrels and the sacrificial layer.

Referring to FIG. 11, any conventional etching process is then used to transfer the pattern of resist mandrels 130 into the amorphous silicon layer 124, resulting in a corresponding plurality of spaced amorphous silicon mandrels 134. Again, one of the amorphous silicon mandrels is located over the first block 110, and one of the spaces 135 between a pair of adjacent amorphous silicon mandrels is located over the second block 118. Referring to FIG. 12, an oxide spacer layer 136 is deposited over the sacrificial layer and the plurality of amorphous silicon mandrels. Therefore, the top 138 and opposing sides 140 of each amorphous silicon mandrel and the spaces 135 between and edges of the sacrificial layer 141 are covered by the oxide spacer layer. Suitable oxides and methods for depositing the oxide are known and available in the art.

Figure 13:
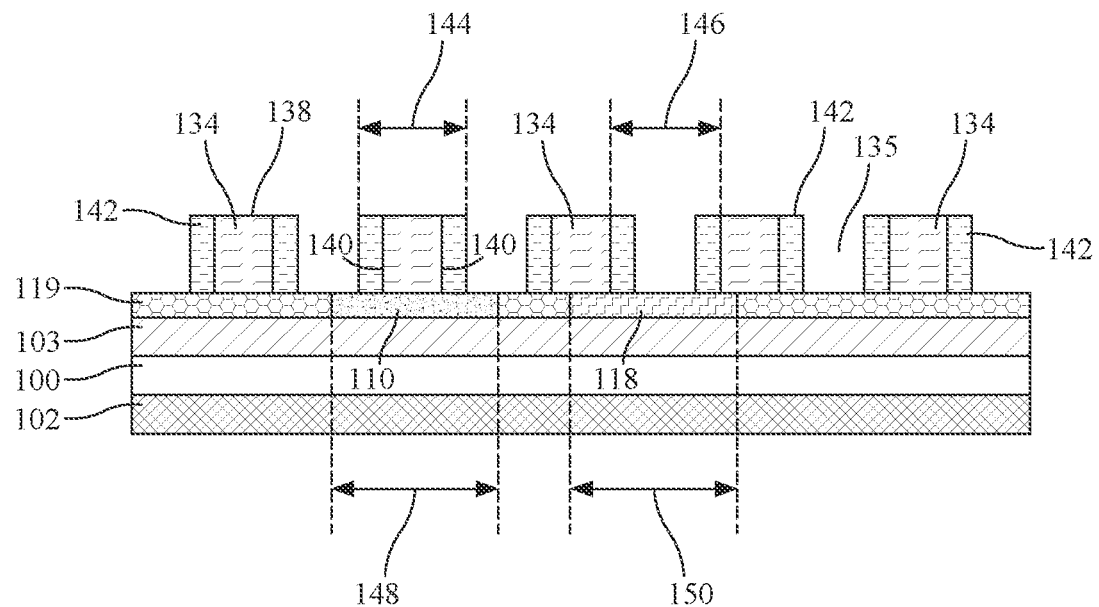
FIG. 13 is a schematic representation of the oxide spacer removed from the top of the mandrels and the spaces between mandrels.

Referring to FIG. 13, the spacer oxide is then removed from the top 138 of each amorphous silicon mandrel 134 and from portions of the space 135 between each adjacent pair of amorphous silicon mandrels and portions of the edges of the sacrificial layer. This leaves a plurality of spacers 142 extending up from the sacrificial layer on opposing sides 140 of each amorphous silicon mandrel. Each spacer is formed of the oxide used for the oxide spacer layer. The oxide spacer layer is etched using, for example, an anisotropic etching process or RIE. The combination of each amorphous silicon mandrel and spacers defines a mandrel critical dimension 144, and the space between opposing pairs of amorphous silicon mandrels, which includes a spacer associated with each amorphous silicon mandrel, defines a non-mandrel critical dimension. The first block has a first block width 148 that is equal to or greater than (and aligned with) the mandrel critical dimension, and the second block has a second block width 150 that is equal to or greater than the non-mandrel critical dimension.

Figure 14:
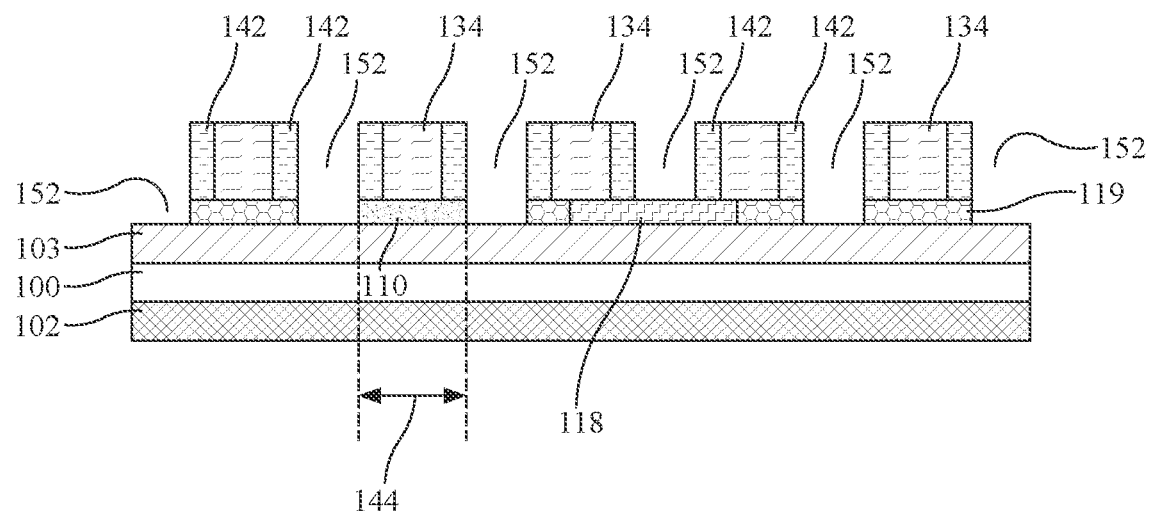
FIG. 14 is a schematic representation of a mandrel critical dimension formed in the first block.
Figure 15:
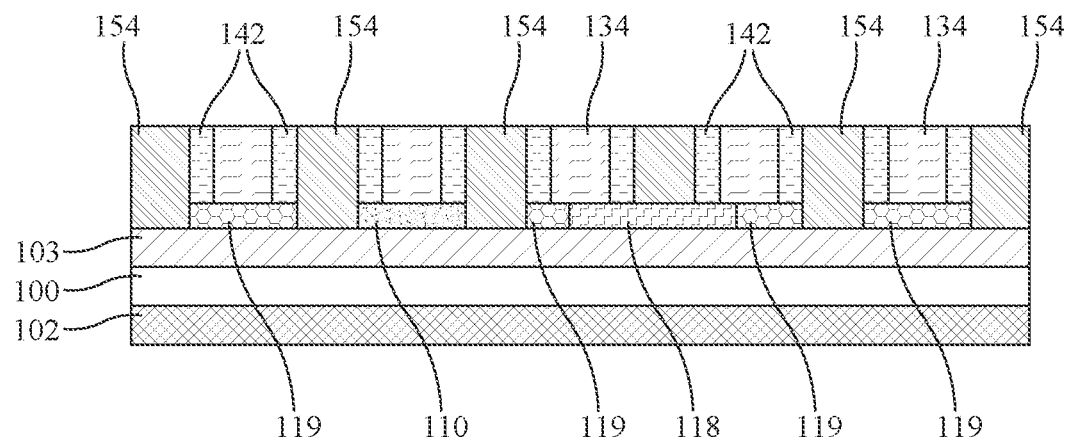
FIG. 15 is a schematic representation of an OPL backfill added to fill the etched portions.

The different materials of the first and second blocks are then utilized in a separate gas plasma etching processes to transfer the critical dimensions to the first and second blocks. Since gas etching can print smaller dimensions, the use of a gas plasma etching process overcomes the dimensional and functional limitations of other physical printing and etching processes in particular for 26 nm pitches and a 7 nm node. Referring to FIG. 14, RIE is used with $Cl_2$ gas to simultaneously etch the TiARC 119 and the first block 110. This transfers the mandrel critical dimension 144 to the first block. The second block 118 is not etched. But the TiARC is removed in the gaps 152 outside the spacers 142, exposing the oxide layer 103. Referring to FIG. 15, all of these gaps are filled with an additional OPL 154, using any suitable process of depositing an OPL into a plurality of gaps.

Figure 16:
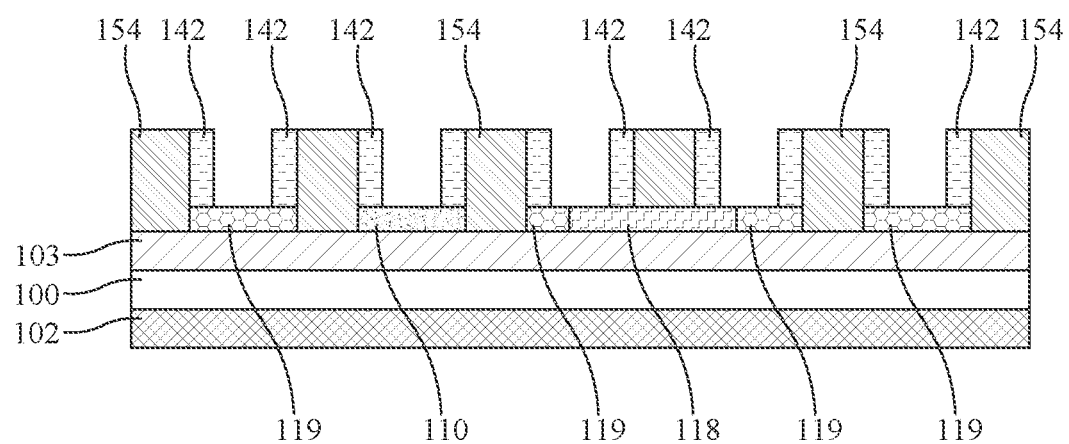
FIG. 16 is a schematic representation of the removal of the amorphous silicon mandrels.
Figure 17:
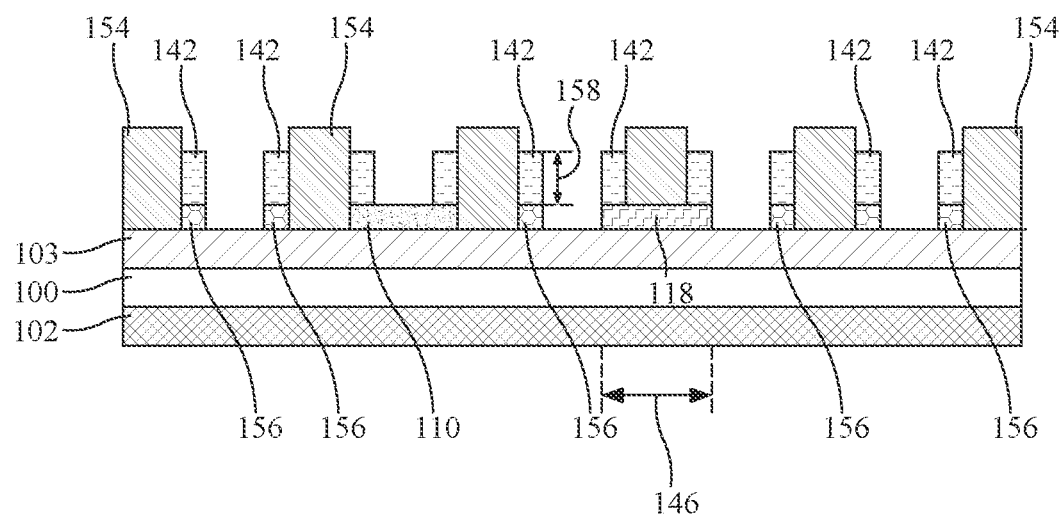
FIG. 17 is a schematic representation of the etching of the non-mandrel critical dimension into the second block and the etching of the spacers into the TiARC.

Referring now to FIG. 16, the amorphous silicon mandrels are pulled or removed without affecting the first block 110 sized to the mandrel critical dimension, the second block 118, the remaining portions of the TiARC 119 in the sacrificial layer, the additional OPL 154 and the plurality of spacers 142. In one embodiment, RIE with hydrogen bromide gas is used to remove the amorphous silicon mandrels. Referring to FIG. 17, the non-mandrel critical dimension 146 is then transferred to the second block while simultaneously removing the TiARC 119 that is not masked by the plurality of spacers 142. This results in a plurality of TiARC spacers 156 corresponding in size and location to the oxide layer spacers 142. Again, a gas plasma etching process is used to simultaneously etch the TiARC and the second block. In addition, the height 158 will shrink, but the first block 110 will not be etched. Suitable methods for simultaneously etching the second block and the TiARC include using a gas plasma etching process such as RIE with $CF_4$.

Figure 18:
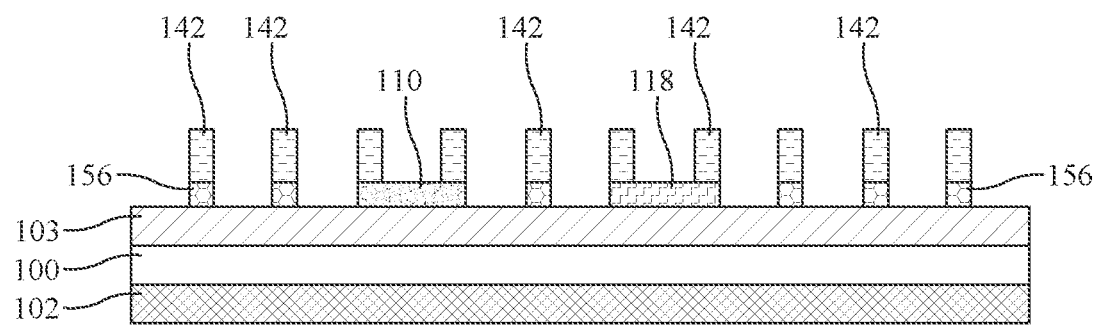
FIG. 18 is a schematic representation of the removal of the OPL.
Figure 19:
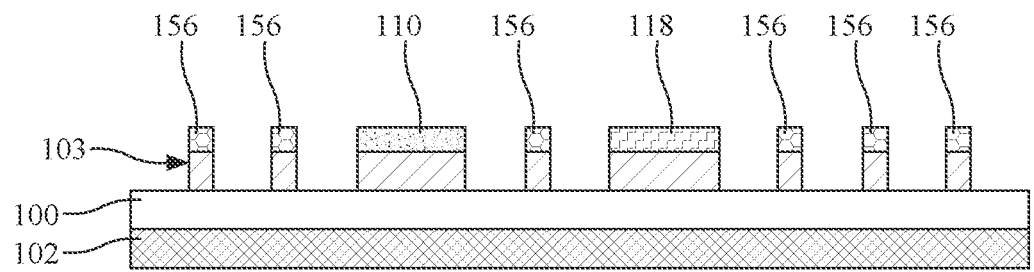
FIG. 19 is a schematic representation of the etching of the mandrel critical dimension, non-mandrel critical dimension, spacer dimensions into the oxide layer with oxide spacer removal.

Referring to FIG. 18, the additional OPL that were used a filler are then removed, leaving the plurality of spacers 142 over the TiARC spacers, the first block 110 and the second block 118. Suitable methods for removing the additional OPL including using an OPL etching process as is known and available in the art. Referring to FIG. 9, the oxide spacers are removed and the pattern defined by the TiARC spacers 156, the first block 110 and the second block is simultaneously etched into the oxide layer 103 below the sacrificial layer. Any convention oxide RIE process known and available in the art is used to remove the spacers and etch the oxide layer. This also exposes portions of the final layer, e.g., TiN or silicon, that are not masked or covered by the pattern defined by the TiARC spacers, the first block 110 and the second block 118.

Figure 20:
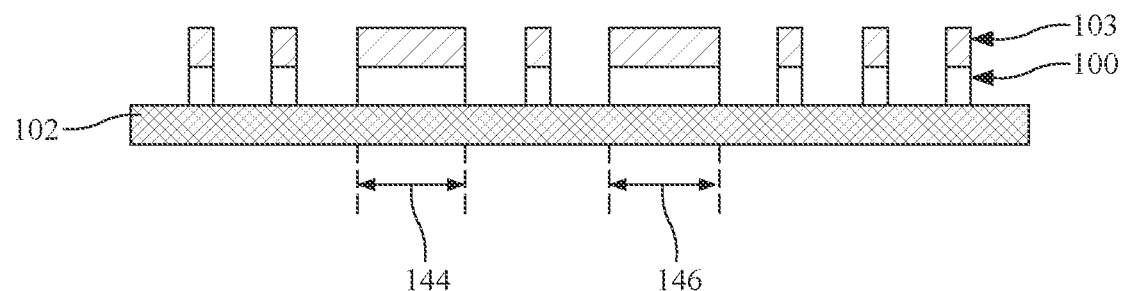
FIG. 20 is a schematic representation of the etching of the mandrel critical dimension, non-mandrel critical dimension, spacer dimensions into the final layer.

Referring to FIG. 20, these exposed portions can then be etched and the TiARC spacers, the first block and the second block simultaneously removed using a suitable gas plasma etching process. In one embodiment, the gas plasma etching process is RIE with $Cl_2$ gas. Therefore, the remaining portions of the oxide layer can also be removed (not shown)

by any suitable process, for example, oxide RIE. Overall, the desired pattern containing the mandrel critical dimension, the non-mandrel critical dimension and the oxide spacer dimensions is etched into the final layer. These dimensions are suitable for transistor patterns having a pitch of 26 nm or less and a 7 nm node. The critical dimensions are achieved with greater tolerances than possible with conventional etching processes. Second and subsequent final layers can be added on top of this final layer, and the desired patterns can be etched into these second and subsequent final layers by repeating the block formation and SIT process steps described above. Therefore, a three-dimensional pattern of transistors is formed in the semiconductor device.

Figure 21:
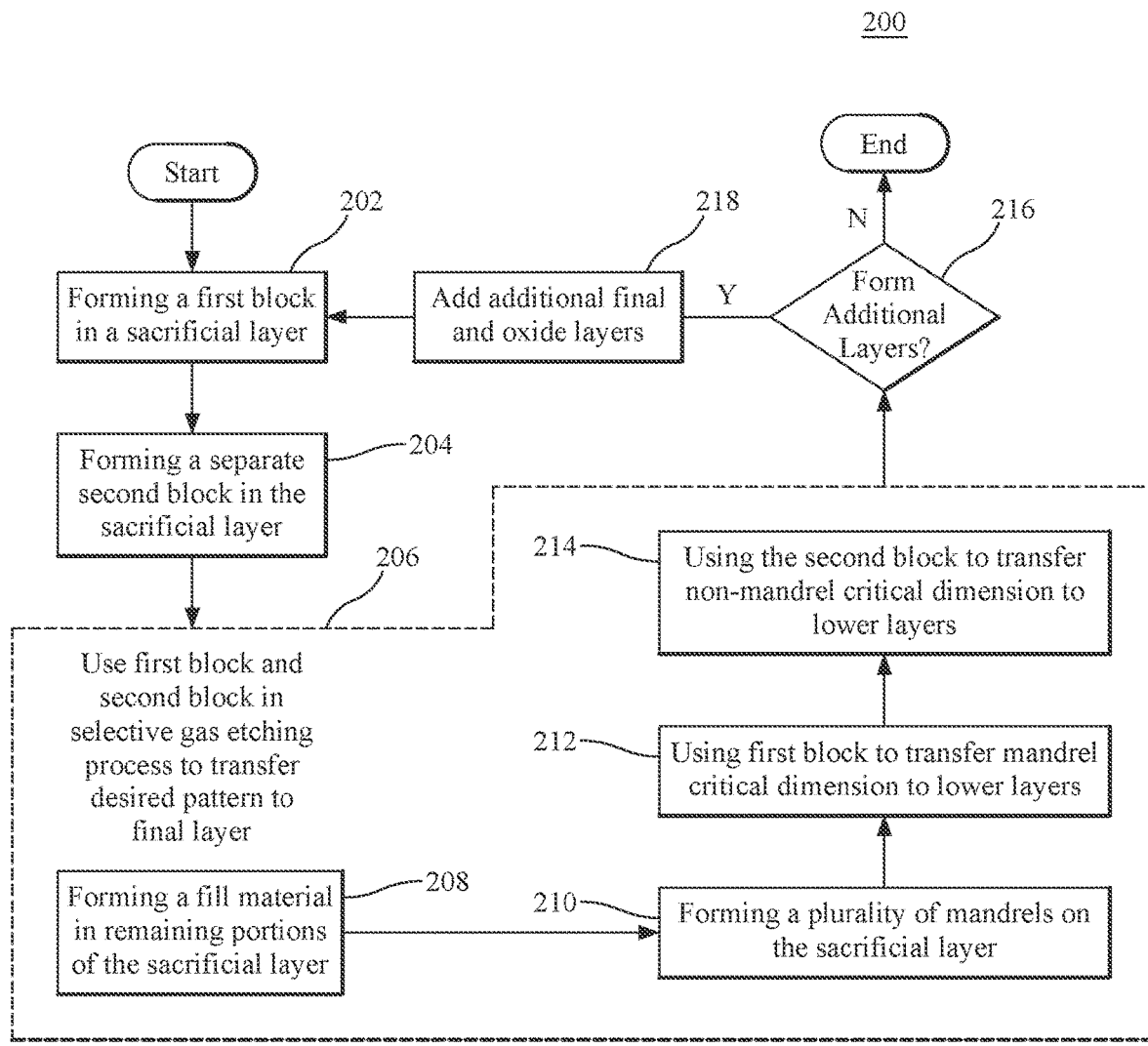
FIG. 21 is a flow chart illustrating an embodiment of a method for selective gas etching for self-aligned pattern transfer.

Referring to FIG. 21, exemplary embodiments are also directed to a method for selective gas etching for self-aligned pattern transfer 200. A first block is formed in a sacrificial layer 202. The sacrificial layer is a layer that is used to transfer the desired pattern to a final layer, e.g., a TiN or silicon layer, in the semiconductor product. The sacrificial layer can be located directly on top of the final layer or on top of an oxide layer that is on top of the final layer. The first block is formed of a first hardmask material that can be plasma etched using a first gas. Suitable first hardmask materials include inorganic hardmask materials. In one embodiment, the first hardmask material is TiN, and the first gas is $Cl_2$. In one embodiment, the first block is formed by depositing the first hardmask material across the sacrificial layer, and forming a first photoresist stack containing two layers, a silicon containing anti-reflective coating and an organic planarization layer, on the first hardmask material. The first photoresist stack has a size and location corresponding to the first block in the sacrificial layer. Reactive ion etching with carbon tetrafluoride is used to remove the silicon containing anti-reflective coating. Next, reactive ion etching with the first gas, e.g., chlorine gas, is used to etch the first hardmask material that is not located under the first photoresist stack. Plasma etching, for example using any conventional plasma etching technique, is used to remove the organic planarization layer, leaving only the first block in the sacrificial layer.

A second block, separate from the first block is also formed in the sacrificial layer 204. The second block is formed from a second hardmask material that can be plasma etched using a second gas that is separate from the first gas. Suitable second hardmask materials include inorganic hardmask materials. In one embodiment, the second hardmask material is SiN and the second gas is $CH_3F$. In one embodiment, forming the second block includes depositing the second hardmask material across the sacrificial layer and over the first block and adjusting a second hardmask material thickness to equal a first block thickness. A second photoresist stack with two layers, a silicon containing anti-reflective coating and an organic planarization layer, is formed on the second hardmask material. The second photoresist stack has a size and location corresponding to the second block. Reactive ion etching with the second gas, e.g., fluoromethane, is used to remove the silicon containing anti-reflective coating and to etch the second hardmask material. Next, plasma etching, using any known plasma etching technique, is used to remove the organic planarization layer, leaving only the second block and the first block in the sacrificial layer.

In order to provide for selective etching, the first and second hardmask materials are selected such that the first hardmask material is not plasma etched using the second gas and the second hardmask material is not plasma etched using the first gas. The first block and the second block are formed with dimensions along the sacrificial layer, i.e., in two dimensions, that are greater than or equal to critical dimensions to be transferred to layers below the sacrificial layer.

The first and second blocks in the sacrificial layer are then used in a selective gas etching process to transfer the desired pattern to the final layer 206. The gas etching provides for increased precision in the transfer of critical dimensions and avoids pitch walking. In addition, the use of different gases allows for selective or targeted etching of materials and masks at different steps in the process. In one embodiment, the sacrificial layer with the first block and the second block is used in sidewall image transfer (SIT) to transfer the desired pattern into layers below the sacrificial layer, i.e., the final layer and an oxide layer.

In order to using the first and second blocks to transfer the desired pattern, a fill material is formed in the remaining portions of the sacrificial layer 208, i.e., portions that do not include the first block or the second block. In one embodiment, a fill material is selected that can be etched by both the first gas and the second gas. In one embodiment, forming the fill material includes depositing a titanium containing anti-reflective coating across the sacrificial layer and over the first block and second block. The titanium containing anti-reflective coating thickness is then adjusted to equal a first block thickness and a second block thickness.

A plurality mandrels, preferably a plurality of amorphous silicon mandrels, are then formed on the sacrificial layer 210. The plurality of mandrels is formed such that one mandrel is located above the first block and one space between adjacent mandrels is located above the second block. In one embodiment, forming the plurality of mandrels on the sacrificial layer includes depositing an amorphous silicon layer on the sacrificial layer, and depositing an organic planarization layer on the amorphous silicon layer. A silicon containing anti-reflective coating layer is deposited on the organic planarization layer, and a plurality of resist mandrels is formed on the silicon containing anti-reflective coating layer. The amorphous silicon layer is etched to form the plurality of amorphous silicon mandrels corresponding to the plurality of resist mandrels. Any suitable methods known and available in the art to deposit, form and etch these layers can be used. By placing the first clock below a mandrel and the second block below a space between adjacent mandrels, the first block controls variations in the width or size of mandrels, and the second block controls variations in the width or size of the spaces between adjacent mandrels. Therefore, the first and second blocks are inversely controlling widths or critical dimensions since increases in mandrel width will produce decreases in space widths while decreases in mandrel width will produce increase in space widths.

The first block, being located beneath a mandrel is used to transfer a mandrel critical dimension to layers below the sacrificial layer 212, and the second block, being located beneath the spaced between adjacent mandrels is used to transfer a non-mandrel critical dimension to the layers below the sacrificial layer 214. The lower layers include the final layer and the oxide layer. In one embodiment, an oxide spacer is deposited over the plurality of amorphous silicon mandrels and the sacrificial layer. An anisotropic etching process is used to remove the oxide spacer from a top of each amorphous silicon spacer and from the space between adjacent amorphous silicon mandrels. This leaves an oxide spacer, e.g., a vertical spacer, on either side of each amorphous silicon mandrel. The first block extends completely under one of the amorphous silicon mandrels and the oxide spacers on either side of one of the amorphous silicon mandrels. In addition, the second block extends completely under the one space between adjacent amorphous silicon mandrels and oxide spacers located on either side of the one space between adjacent amorphous silicon spacers.

In this embodiment with the spacers located on either side of each mandrel, first critical dimension is defined by and includes one of the amorphous silicon mandrels and the oxide spaces on either side of one of the amorphous silicon mandrels. The second critical dimension is defined by and includes the one space between adjacent amorphous silicon mandrels and the oxide spacers located on either side of the one space between adjacent amorphous silicon mandrels. Since the first and second blocks are formed of materials that are plasma etched using different gases, the first gas and the second gas are used in separate reactive ion etching steps to transfer the first critical dimension to the first block and to transfer the second critical dimension to the second block. In one embodiment, the first gas is chlorine gas, and the second gas is carbon tetraflouride gas.

In one embodiment, reactive ion etching with the first gas is used to transfer the first critical dimension to the first block, to transfer the first critical dimension into the titanium containing anti-reflective coating layer, i.e., the fill material, located under amorphous silicon mandrels and the oxide spaces on either side of the amorphous silicon mandrels and to remove the first block and titanium containing anti-reflective coating layer located in spaces between oxide spacers located on either side of spaces between adjacent amorphous silicon mandrels. Reactive ion etching with the second gas is then used to transfer the second critical dimension to the second block and to transfer a spacer width for each oxide spacer to the titanium containing anti-reflective coating layer, i.e., the fill layer.

All spaces between oxide spacers located on either side of spaces between adjacent amorphous silicon mandrels are filled with a backfill organic planarization layer following reactive ion etching with the first gas. Reactive ion etching with hydrogen bromide is used to remove the amorphous silicon mandrels before reactive ion etching with the second gas. Plasma etching is used to remove the backfill organic planarization layer, and oxide reactive ion etching is used to remove the plurality of oxide spacers and to etch a final pattern into an oxide layer below the sacrificial layer. The final pattern is defined by the second block, the first block and the spacer widths in the titanium containing anti-reflective coating layer corresponding to each oxide spacer in the plurality of oxide spacers in the sacrificial layer. Reactive ion etching with ion gas is used to etch the final pattern into the final layer, e.g., TiN, below the oxide layer and to remove the sacrificial layer. Therefore, the desired pattern is transferred into the final layer.

In order to add additional two-dimensional patterns or to create three-dimensional patterns in the multi-layer semiconductor produce, a termination is made regarding whether additional layers, and patterns in those additional layers, are to be formed 216. If additional layers are to be formed, one or more additional final layers and one or more additional oxide layers are formed 218. Then the steps of forming the two blocks and using those blocks to transfer the desired critical dimension are repeated. If not additional layers are needed, then the process is terminated.

As will be appreciated by one skilled in the art, aspects of the present invention may be embodied as a system, method or computer program product. Accordingly, aspects of the present invention may take the form of an entirely hardware embodiment or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to apparatus (systems) and computer program products according to embodiments of the invention. It will be understood that each description and illustration can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the block diagram block or blocks.

The schematic illustrations and block diagrams in the Figures illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

Methods and systems in accordance with exemplary embodiments of the present invention can take the form of an entirely hardware embodiment, an entirely software embodiment or an embodiment containing both hardware and software elements. In a preferred embodiment, the invention is implemented in software, which includes but is not limited to firmware, resident software and microcode. In addition, exemplary methods and systems can take the form of a computer program product accessible from a computer-usable or computer-readable medium providing program code for use by or in connection with a computer, logical processing unit or any instruction execution system. For the purposes of this description, a computer-usable or computer-readable medium can be any apparatus that can contain, store, communicate, propagate, or transport the program for use by or in connection with the instruction execution system, apparatus, or device. Suitable computer-usable or computer readable mediums include, but are not limited to, electronic, magnetic, optical, electromagnetic, infrared, or semiconductor systems (or apparatuses or devices) or propagation mediums. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Suitable data processing systems for storing and/or executing program code include, but are not limited to, at least one processor coupled directly or indirectly to memory elements through a system bus. The memory elements include local memory employed during actual execution of the program code, bulk storage, and cache memories, which provide temporary storage of at least some program code in order to reduce the number of times code must be retrieved from bulk storage during execution. Input/output or I/O devices, including but not limited to keyboards, displays and pointing devices, can be coupled to the system either directly or through intervening I/O controllers. Exemplary embodiments of the methods and systems in accordance with the present invention also include network adapters coupled to the system to enable the data processing system to become coupled to other data processing systems or remote printers or storage devices through intervening private or public networks. Suitable currently available types of network adapters include, but are not limited to, modems, cable modems, DSL modems, Ethernet cards and combinations thereof.

In one embodiment, the present invention is directed to a machine-readable or computer-readable medium containing a machine-executable or computer-executable code that when read by a machine or computer causes the machine or computer to perform a method for selective gas etching for self-aligned pattern transfer in accordance with exemplary embodiments of the present invention and to the computer-executable code itself. The machine-readable or computer-readable code can be any type of code or language capable of being read and executed by the machine or computer and can be expressed in any suitable language or syntax known and available in the art including machine languages, assembler languages, higher level languages, object oriented languages and scripting languages. The computer-executable code can be stored on any suitable storage medium or database, including databases disposed within, in communication with and accessible by computer networks utilized by systems in accordance with the present invention and can be executed on any suitable hardware platform as are known and available in the art including the control systems used to control the presentations of the present invention.

While it is apparent that the illustrative embodiments of the invention disclosed herein fulfill the objectives of the present invention, it is appreciated that numerous modifications and other embodiments may be devised by those skilled in the art. Additionally, feature(s) and/or element(s) from any embodiment may be used singly or in combination with other embodiment(s) and steps or elements from methods in accordance with the present invention can be executed or performed in any suitable order. Therefore, it will be understood that the appended claims are intended to cover all such modifications and embodiments, which would come within the spirit and scope of the present invention.

What is claimed is:
1. A method comprising:
providing a first stack of layers on a substrate;
forming a first block comprising a first block material on the first stack of layers;
forming a second block comprising a second block material on the first stack of layers, wherein the second block is separate from the first block;
forming a second stack of layers above the first block and the second block;

forming a plurality of mandrels from the second stack of layers; and forming spacers on the plurality of mandrels, the spacers comprising:
- a first pair of spacers adjacent to a first mandrel of the plurality of mandrels and aligned above the first block, and
- a second pair of spacers aligned above the second block, a first spacer of the second pair of spacers being adjacent to a second mandrel of the plurality of mandrels and a second spacer of the second pair of spacers being adjacent to a third mandrel of the plurality of mandrels, wherein the second pair of spacers are adjacent spacers separated by a non-mandrel space.

2. The method of claim 1, further comprising:
etching at least one layer of the first stack of layers to form a pattern, wherein the pattern comprises (i) a first feature having a size corresponding to a spacer width, (ii) a second feature having a size corresponding to a width of the first mandrel plus a width of the first pair of spacers, and (iii) a third feature having a size corresponding to a width of the non-mandrel space plus a width of the second pair of spacers.

3. The method of claim 1, wherein an upper surface of a bottommost layer of the second stack of layers is substantially coplanar with an upper surface of the first block and an upper surface of the second block.

4. The method of claim 3, further comprising:
etching the first stack of layers to form a pattern, wherein the pattern corresponds to regions where there was (i) a spacer, and (ii) a mandrel above the first block, and (iii) a gap between spacers associated with adjacent mandrels, above the second block.

5. The method of claim 1, further comprising:
filling gaps between spacers with an organic planarization layer (OPL).

6. The method of claim 5, further comprising:
selectively removing the plurality of mandrels to create mandrel gaps.

7. The method of claim 6, further comprising:
selectively etching through the mandrel gaps to an uppermost layer of the first stack of layers.

8. The method of claim 7, further comprising:
selectively removing the OPL.

9. The method of claim 1, further comprising:
etching the first stack of layers to form a pattern, wherein the pattern comprises (i) a first feature having a size corresponding to a spacer width, (ii) a second feature having a size corresponding to a mandrel width plus two spacer widths, and (iii) a third feature having a size corresponding to two spacer widths plus a non-mandrel space width.

10. The method of claim 1, further comprising:
selectively etching the first block with respect to the second block.

11. The method of claim 1, wherein the spacers have a pitch less than or equal to 26 nanometers (nm).

12. A method comprising:
providing a plurality of mandrels above a stack of layers, wherein a first layer of the stack of layers comprises a first block, a second block, and a first fill material; and forming spacers on the plurality of mandrels,
wherein there are non-mandrel spaces between spacers of adjacent mandrels,
wherein (i) at least one mandrel, (ii) a first spacer associated with the at least one mandrel, and (iii) a second spacer associated with the at least one mandrel are aligned above the first block, and
wherein (i) at least one non-mandrel space (ii) a third spacer associated with the at least one non-mandrel space, and (iii) a fourth spacer associated with the at least one non-mandrel space are aligned above the second block.

13. The method of claim 12, wherein providing the first layer of the stack of layers comprises:
depositing a first block material on a second layer of the stack of layers;
patterning and etching the first block material to form the first block;
depositing a second block material on the second layer of the stack of layers and on the first block;
patterning and etching the second block material to form the second block;
depositing a first fill material on (i) the second layer of the stack of layers, (ii) the first block, and (iii) the second block; and
planarizing the first fill material such that an uppermost surface of the first fill material is substantially coplanar with (i) an upper surface of the first block and (ii) an upper surface of the second block.

14. The method of claim 13, further comprising:
selectively etching (i) regions of the first fill material and (ii) the first block through the non-mandrel spaces to at least the second layer of the stack of layers.

15. The method of claim 14, further comprising:
filling regions of the non-mandrel spaces with a second fill material.

16. The method of claim 15, further comprising:
selectively removing the mandrels to create mandrel gaps.

17. The method of claim 16, further comprising:
selectively etching (i) regions of the first fill material and (ii) the second block through the mandrel gaps to at least the second layer of the stack of layers.

18. The method of claim 17, further comprising:
selectively removing the second fill material.

19. The method of claim 18, wherein removing the second fill material provides a pattern comprising pattern features, the pattern features comprising:
- a first feature having a size corresponding to spacer width;
- a second feature having a size corresponding to a mandrel width plus two spacer widths; and
- a third feature having a size corresponding to two spacer widths plus a non-mandrel space width.

20. The method of claim 12, wherein the spacers have a pitch less than or equal to 26 nanometers (nm).

* * * * *